United States Patent
Tang et al.

(10) Patent No.: US 8,304,054 B2
(45) Date of Patent: Nov. 6, 2012

(54) PRINTED CIRCUIT BOARD MADE FROM A COMPOSITE MATERIAL

(75) Inventors: Xinhe Tang, Vienna (AT); Ka Chun Tse, Hong Kong (CN); Ernst Hammel, Vienna (AT); Ben Zhong Tang, Hong Kong (CN)

(73) Assignee: Curamik Electronics GmbH, Eschenbach (DE)

( * ) Notice: Subject to any disclaimer, the term of this patent is extended or adjusted under 35 U.S.C. 154(b) by 0 days.

(21) Appl. No.: 13/274,851

(22) Filed: Oct. 17, 2011

(65) Prior Publication Data

US 2012/0031653 A1 Feb. 9, 2012

Related U.S. Application Data

(63) Continuation of application No. 12/086,983, filed as application No. PCT/IB2006/003030 on Aug. 10, 2006, now Pat. No. 8,119,220.

(30) Foreign Application Priority Data

Dec. 23, 2005 (DE) .......... 10 2005 062 181

(51) Int. Cl.
*B32B 5/12* (2006.01)
*B32B 27/38* (2006.01)
*C08L 63/00* (2006.01)
*C08L 67/00* (2006.01)
*H01F 1/42* (2006.01)

(52) U.S. Cl. ........ 428/114; 428/98; 428/105; 428/298.1

(58) Field of Classification Search ............ 428/114, 428/98, 105, 298.1
See application file for complete search history.

(56) References Cited

U.S. PATENT DOCUMENTS

| 5,458,967 | A | 10/1995 | Kanno et al. |
| 6,103,812 | A | 8/2000 | Wei et al. |
| 6,265,466 | B1 | 7/2001 | Glatkowski et al. |
| 2004/0245910 | A1 | 12/2004 | Tang et al. |
| 2005/0017012 | A1 | 1/2005 | Hodge |
| 2005/0119371 | A1 | 6/2005 | Drzal et al. |
| 2006/0025515 | A1* | 2/2006 | Scaringe et al. ............ 524/496 |
| 2006/0081819 | A1 | 4/2006 | Li et al. |
| 2006/0113511 | A1* | 6/2006 | Chen ...................... 252/500 |

FOREIGN PATENT DOCUMENTS

| DE | 10224185 | 12/2002 |
| EP | 1 457 509 | 9/2004 |
| JP | 2002146672 | 5/2002 |
| JP | 2005-389802 | 5/2005 |
| JP | 2005159225 | 6/2005 |
| WO | WO 01/72919 | 10/2001 |
| WO | WO2005/028174 | 3/2005 |
| WO | WO2006030945 | 3/2006 |

OTHER PUBLICATIONS

XP-002425968, May 26, 2005, Derwent.

* cited by examiner

*Primary Examiner* — Brent O'Hern
(74) *Attorney, Agent, or Firm* — Welsh Flaxman & Gitler LLC

(57) ABSTRACT

Disclosed is a multilayer material in which at least two components are jointed to each other via an adhesive bond. The adhesive bond is formed by an adhesive or bonding layer containing nanofiber material in a matrix that is suitable as an adhesive.

20 Claims, 2 Drawing Sheets

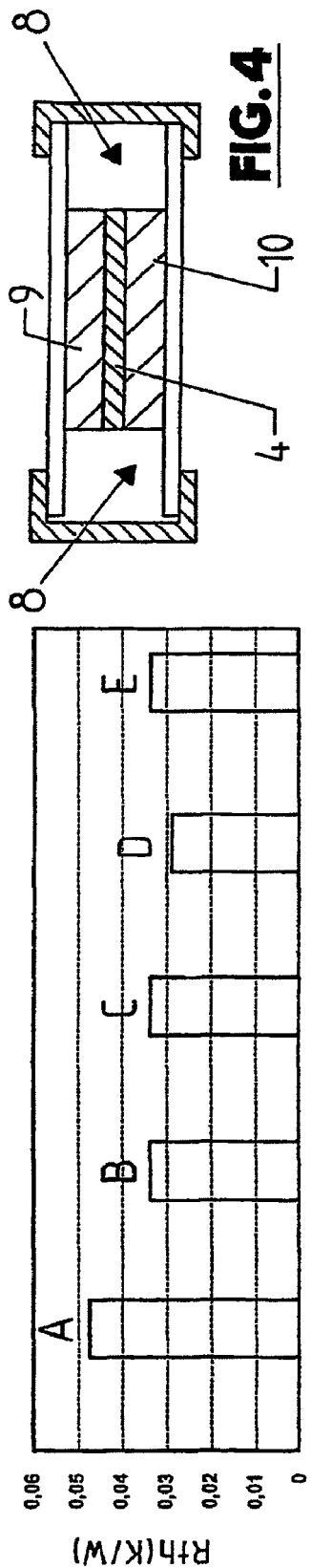
FIG. 4
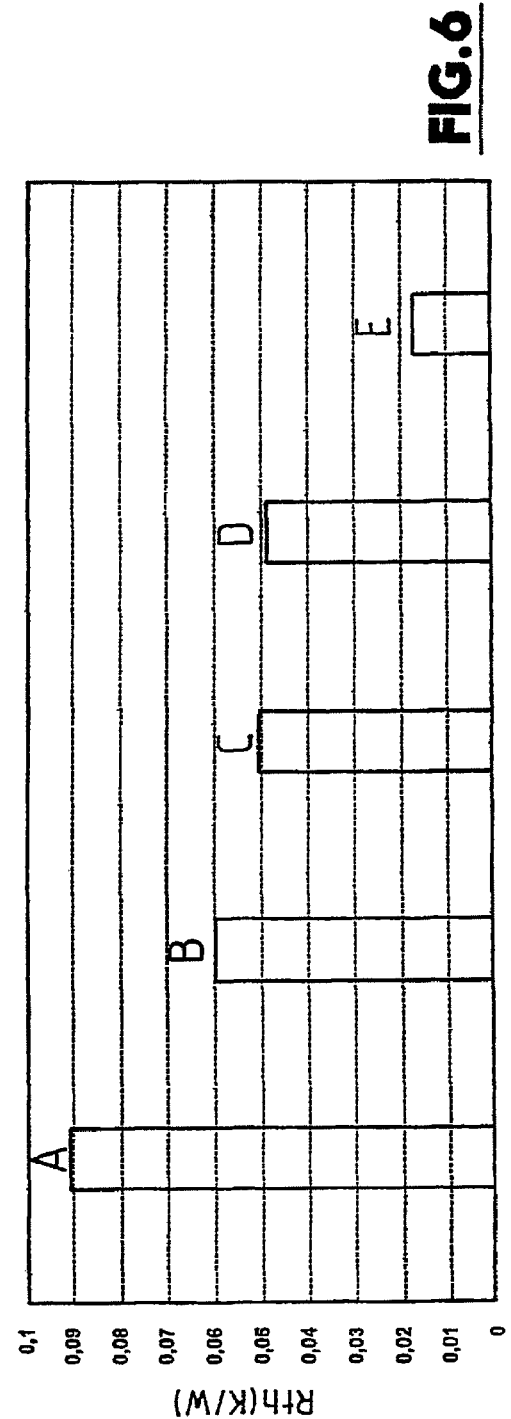
FIG. 5
FIG. 6

PRINTED CIRCUIT BOARD MADE FROM A COMPOSITE MATERIAL

CROSS-REFERENCE TO RELATED APPLICATIONS

This application is a continuation of U.S. patent application Ser. No. 12/086,983, filed Jun. 23, 2003 now U.S. Pat. No. 8,119,220, entitled "Composite Material, Especially Multilayer Material, and Adhesive or Bonding Material" which is currently pending, and which is the National Stage Entry of PCT/IB2006/003030, filed Aug. 10, 2006, which claims the benefit of German Application No. 102005062181.3, filed Dec. 23, 3005.

BACKGROUND OF THE INVENTION

The invention relates to a composite material in the form of a printed circuit board for electric circuits or modules and, in particular, to a composite material consisting of a ceramic or metallic substrate layer and a metallization formed from a thin metal plate or foil bonded to each of the surfaces of the ceramic or metallic substrate layer by an adhesive bond layer. The invention further relates to an adhesive bond material composed of nanofiber material in a synthetic matrix.

The manufacture of composite materials, also as printed circuit boards in the form of metal-ceramic substrates based on DCB technology is known in the art. In this process, the metallization required for the manufacture of strip conductors, connections, etc. is applied on a ceramic, for example on an aluminum-oxide ceramic, using direct copper bonding technology, the metallization being formed by metal or copper foils or metal or copper sheets, comprising on the top side a layer or coating (melt layer) from a chemical bond with the metal and a reactive gas, preferably oxygen.

In this method, which is described for example in U.S. Pat. No. 3,744,120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB method then comprises the following steps:
oxidation of a copper foil so as to produce an even copper oxide layer;
placing of the copper foil on the ceramic layer;
heating the composite to a process temperature between approx. 1025 and 1083° C., e.g. to approx. 1071° C.;
cooling to room temperature.

Also known is the so-called active soldering method (DE 22 13 115; EP-A-153 618) for bonding metal layers or metal foils forming metallizations, in particular also of copper layers or copper foils, with the respective ceramic material. In this process, which is used especially for manufacturing a metal-ceramic substrate, a bond is produced at a temperature of ca. 800-1000° C. between a metal foil, for example a copper foil, and a ceramic substrate, for example aluminum-nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through a chemical reaction, while the bond between the solder and the metal is a metallic hard solder bond.

It is an object of the present invention to provide a composite material for printed circuit boards that can be manufactured in a simple and economical manner, while maintaining optimum thermal properties.

SUMMARY OF THE INVENTION

The composite material according to the invention is preferably a multi-layer material, and preferably is a printed circuit board that is suitable for electric circuits, modules, etc. and is made up of a carrier or a substrate with an electrically insulating material on each of the carrier or substrate sides and a metallization formed by a metal or copper plate or metal or copper foil that is bonded with the substrate by means of the insulating material.

An advantage of the composite material according to the invention is that it can be manufactured easily and economically. Further, the insulating material layers formed by the adhesive or bonding agent compensates for different temperature expansion coefficients of the materials of the metallization and of the substrate. A compensating effect for the thermal expansion of the metallization can be achieved especially in the case of the corresponding orientation of at least one part of the nanofiber material contained in the adhesive bond layer. The nanofiber material is parallel or approximately parallel to the bonded surfaces.

The subject matter of the invention is a printed circuit board with a ceramic layer or a ceramic substrate that is provided at least on one side, preferably on both sides, with a metal plate or a metal foil, preferably with a copper plate or a copper foil. The copper plate or copper foil is connected with the ceramic substrate using a connecting layer. Such printed circuit boards and their metallizations are designed with a relatively large surface area, namely with a square measure of at least 1 cm$^2$ to 2 cm$^2$ and for example up to 260 cm$^2$. At least the metallization on one surface side of the printed circuit board is structured for forming strip conductors, contact surfaces, etc., and the material of the connecting layer between adjacent strip conductors and/or contact surfaces preferably is removed.

Ceramic and copper have very different linear expansion coefficients α, i.e. copper has a thermal linear expansion coefficient α=17 10$^{-6}$K$^{-1}$ and ceramic has a thermal linear expansion coefficient α on the order of 4 10$^{-6}$K$^{-1}$ to 5 10$^{-6}$ K$^{-1}$. For this reason, due to the large surface area of the metallizations in the connecting layer between the ceramic substrate and the respective copper layer, substantial forces (shearing forces) occur in the case of thermal loads and in particular in the case of changing thermal loads. Thermal loads and changing thermal loads result primarily from the soldering temperatures or soldering cycles during connection of components with the printed circuit board, e.g. during soldering of components to the printed circuit board, but also from changing temperatures in a module comprising the printed circuit board during its use, for example for controlling high-power drives.

The invention is based on the principle that it is necessary to select the thermal linear expansion coefficient α of the connecting layer so that it is between the thermal linear expansion coefficient α of ceramic and copper. In the case that the connecting layer is embodied in the form of an adhesive layer of a synthetic material, preferably of epoxy resin, this is achieved in that the adhesive layer contains nanofiber material in the synthetic adhesive matrix, although the thermal linear expansion coefficient α of the synthetic matrix material without nanofibers, e.g. of epoxy resin with α=50 10$^{-6}$K$^{-1}$ is substantially higher than the thermal linear expansion coefficient α of ceramic and copper.

Due to the nanofiber material in the synthetic adhesive matrix the thermal linear expansion coefficient α of the connecting layer is reduced to the value between ceramic and copper. Further, the mechanical and thermal stability of the adhesive layer is improved by the nanofiber material in the synthetic adhesive matrix, so that despite the very different thermal linear expansion coefficient of ceramic and copper no destruction, in particular no formation of cracks occurs within the connecting layer and therefore neither a mechanical weakening of the connection between the copper layer and the ceramic substrate nor, in particular, a reduction of the electric strength of the printed circuit board exhibited by the latter between the two metal or copper layers occurs. Cracks in the hollow spaces in the connecting layer mean an increased electric field strength in the area of the cracks or hollow spaces and therefore a reduction in the overall electric strength. The thermal problems and disadvantages that result from the different thermal linear expansion coefficients α in the absence of nanofiber material are due to the relatively large square measure of the metallizations and occur in printed circuit boards, but not in adhesive connections between components and substrates, as suggested in US 2006/0025515.

The nanofiber material also substantially improves the thermal stability of the connecting layer or of the synthetic material of this layer. While the glass transition temperature for example of epoxy resin at which (glass transition temperature) hardened epoxy resin changes to a soft state is below 180° C., this glass transition temperature is increased by the addition of the nanofiber material to a temperature between 230° C. and 270° C.; as a result of this, despite the very different thermal linear expansion coefficients α between ceramic and copper the possibility exists for the first time to connect or equip the printed circuit board with components by soldering at the normal soldering temperatures of approximately 200° C. to 260° C. without damage to the connection between the respective copper layer and the ceramic substrate.

An essential aspect of the invention consists also in the fact that the nanofiber material is treated at a temperature of approximately 3000° C. for its graphitization prior to being incorporated into the synthetic adhesive matrix. Only through this pre-treatment does the nanofiber material then exhibit the properties necessary for the invention.

BRIEF DESCRIPTION OF THE DRAWINGS

The invention is explained below in more detail based on an exemplary embodiment with reference to the drawings, wherein:

FIG. 4 is a schematic representation of an array for preparation of various test pieces;

FIG. 5 shows the thermal resistance, measured for various test pieces; and

FIG. 6 shows a comparison of the thermal resistance measured in the case of the device in FIG. 3 with different material bonds or multi-layer materials.

DETAILED DESCRIPTION OF THE INVENTION

Figure 1:
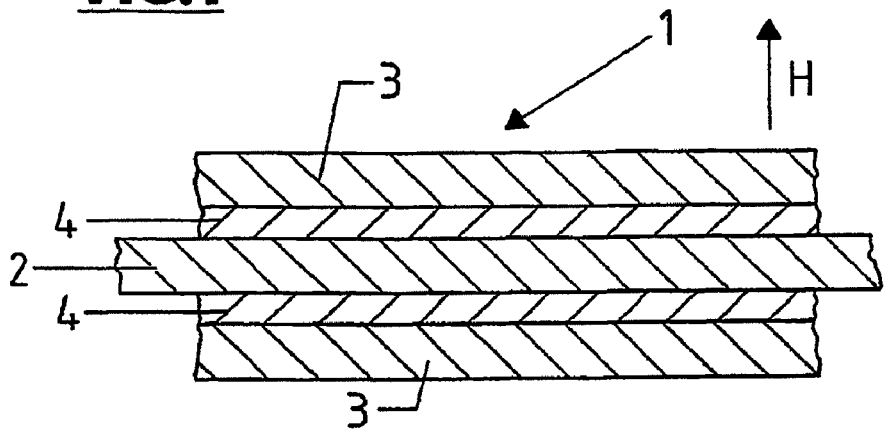
FIGS. 1 and 2 each show a simplified representation of a cross section of a multi-layer material according to the invention.

In FIG. 1, a multi-layer material 1 is suitable as a printed circuit board for electric circuits or modules. The multi-layer material 1 has a carrier or substrate 2, which in this embodiment is manufactured altogether from an electrically insulating material, e.g. from a ceramic, for example, an aluminum-oxide ceramic, an aluminum-nitride ceramic, or a silicon-nitride ceramic. Other materials for the substrate 2 are also conceivable, for example a plastic, e.g. with an epoxy base, etc.

A metallization 3, formed from a thin metal plate or foil, for example from a copper plate or copper foil, is provided two-dimensionally on each surface side of the substrate 2. This metallization 3 is bonded two-dimensionally with the substrate 2 by means of an adhesive or bond layer 4 formed by an adhesive or a bonding material. In the depicted embodiment, the substrate 2 is provided on both surface sides with the metallization 3. The bond material or multi-layer material 1 is therefore symmetrical in relation to a middle plane of the substrate 2, at least with respect to the type and sequence of the individual layers. Fundamentally, it is also possible to provide the metallization 3 on only one surface side of the substrate 2. To manufacture the strip conductors, contact surfaces, etc., the metallization 3 is patterned accordingly using an etching and masking technology known in the art.

Figure 2:
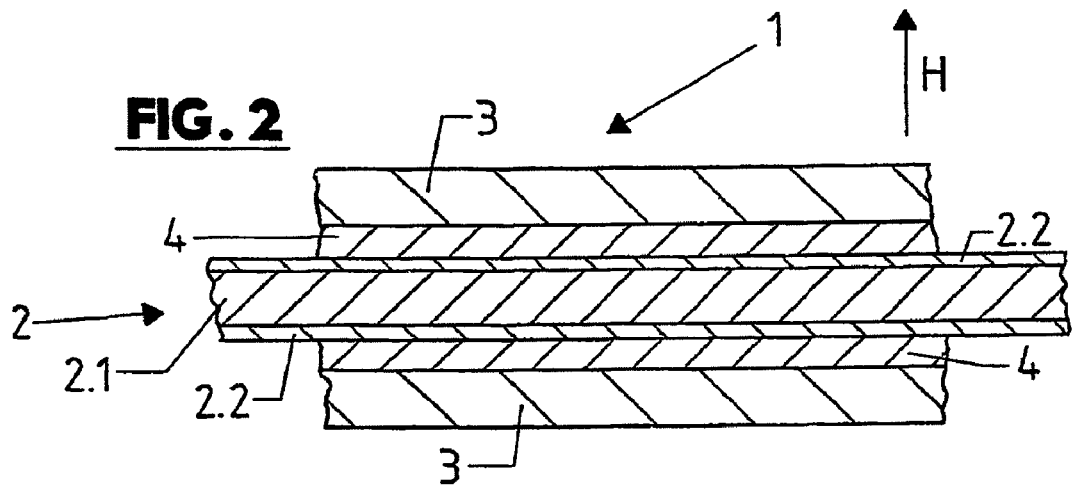

As depicted in FIG. 2, it is possible to design the substrate 2 in multiple layers, namely consisting of a metallic support layer 2.1, for example aluminum, and an insulating layer 2.2 on the surface sides of the lamellar substrate 2, namely where a bond layer 4 adjoins each metallization 3.

A special characteristic of the multi-layer product 1 is that the bond layer 4 contains carbon nanofiber material, carbon nanofibers or nanotubes, in an epoxide resin matrix, resulting in an extremely low thermal resistance RtH (° K/W) or conversely a high thermal conductivity 1/Rth for the bond layer, i.e. a multi-layer material 1 with a substrate 2 made of an aluminum-oxide ceramic is by all means comparable in terms of the thermal conductivity and the thermal resistance between the upper and lower metallization 3 with a multi-layer material in which the metallizations are applied to the ceramic substrate using DCB technology, as explained in more detail below. The matrix contains approximately 5 to 30 percent by weight nanofiber material relative to the total weight of the adhesive or bond material.

In a preferred embodiment, a carbon nanofiber, available commercially as "Pyrograf III", is used as the nanofiber material. This material is heated at a temperature of 3000° C. before being mixed into the matrix, and also before any pre-treatment. A matrix with an epoxy base, for example polyester, is used for the matrix. To achieve optimum binding of the nanofiber material in the matrix material, a solvent is used; especially suitable for this purpose is triethylene glycol monobutylether.

Figure 3:
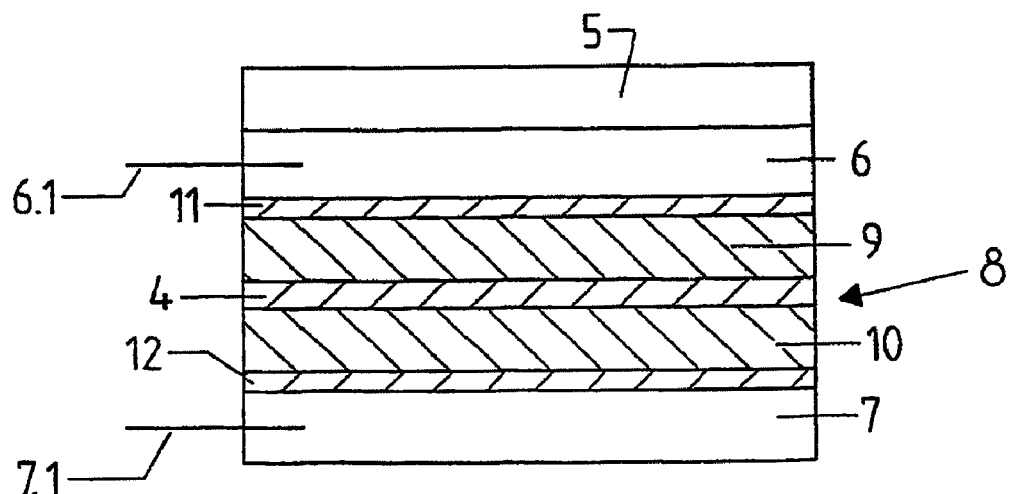
FIG. 3 is a schematic representation of a measuring array for determining the thermal behavior of a thermal compound embodied as an adhesive or of a thermal adhesive according to the invention.

FIG. 3 shows in a schematic representation, an array for measuring the thermal resistance caused by the bond layer 4. The array is made up of an upper heating plate 5, a measuring plate 6 adjoining said heating plate and optimally connected to the same for heat transfer and of a lower measuring plate 7. The measuring plates 6 and 7 are provided with temperature gauges or sensors 6.1 and 7.2, which are used to measure the exact temperature of said plates and to send the measured values to measuring or analysis electronics. The heating plate 5 is operated electrically, namely for example with a heating voltage of 60 volts and with a constant heating current of 2.7 amperes, for example, so that a precisely defined, constant heat quantity is generated by the heat plate 5 during the measuring process.

The respective test piece 8, which is made up of two copper plates 9 and 10, which are connected with each other via the hardened bond layer 4, is located between the two measuring plates 6 and 7. To achieve a lossless transfer of heat between the test piece 8 and the measuring plates 6 and 7, a layer 11 and 12 made of a conventional thermal compound with known properties is provided respectively between the measuring plates 6 and 7 and the adjacent plates 9 and 10.

The thermal resistance Rth is defined as follows:

$$Rth(°K/W) = (T1-T2)/\text{output of the heater 5 in W; the thermal conductivity is then } 1/Rth.$$

FIG. 5 is a graph showing the thermal resistance Rth in ° K/W measured for various test pieces, namely:

Position A: with stacked plates 9 and 10 that are not bonded by the bond layer 4;

Positions B-E: each with plates 9 and 10 that are bonded by the bond layer 4, however;

Position B: without further temperature treatment;

Position C: with treatment of test piece 8 for 2.8 days at a temperature of 120° C.;

Position D: with treatment of test piece 8 for 6 days at a temperature of 120° C.;

Position E: with treatment of test piece 8 for 1 day at a temperature of 160° C.

FIG. 5 shows that the thermal conductivity of the bond layer 4 improves with longer temperature exposure, apparently due to further hardening of this layer. The measurements also show that the thermal resistance Rth measured at the respective test piece 8 decreases slightly only initially, i.e. in an initial phase of each measurement, apparently due to the sluggishness of the measuring system, and then remains constant after this initial phase.

FIG. 6 shows by way of comparison the thermal resistance of a copper-ceramic multi-layer material. For this measurement, instead of the test pieces 8 with the two copper plates 9 and 10, test pieces were used in which the lower copper plate 10 was replaced with a ceramic plate or a ceramic substrate of the same size. Position A in FIG. 6 shows the thermal resistance Rth (° K/W) of a test piece in which the upper plate 9 made of copper bears against the lower plate 10 made of ceramic (aluminum-oxide ceramic) without a bond. Positions B and D refer to measurements in which the upper plate 9 made of copper is bonded with the lower plate 10 made of ceramic by means of the bond layer 4, namely Position B: with treatment of test piece 8 for 3 days at a temperature of 150° C. and Position D: without further treatment of the test piece 8.

Position C shows by way of comparison the thermal resistance of a DCB substrate. Position E is the thermal resistance measured with the measuring device of FIG. 3 without the test piece 8, i.e. with measuring plates 6 and 7 bearing against each other directly via the layers 11 and 12.

It goes without saying that plates 9 and 10 of the same size were used for all measurements.

The thermal conductivity of the bond layer 4 can be significantly increased by the use of nanofibers which are made of the nanofiber material that have an optimum length, i.e. these fibers or at least the majority of these fibers have a length between 1 and 100μ, preferably 10μ, and/or by pre-treatment of the nanofiber material and optimum binding of the nanofiber material in the matrix forming the bond material as a result of this pre-treatment. This length corresponds to the surface unevenness that normally exists with ceramic substrates and/or copper foils, so that this unevenness can be optimally compensated with nanofibers of this length.

A further improvement of the thermal conductivity of the bond layers 4 and therefore an improvement of the thermal properties of the multi-layer material 1 is achieved by orientation of the nanofibers or nanotubes at least primarily in the direction of the thermal flux, for example by making the nanofibers or nanotubes ferromagnetic prior to their inclusion in the matrix, i.e. for example by being coated with nanoparticles made of a ferromagnetic material. During the manufacture of the multi-layer material 1, the nanofibers or nanotubes are then optimally oriented by means of an external magnetic field (Arrow H) so that these nanofibers or nanotubes are oriented perpendicular or at least approximately perpendicular to the surface sides of the substrate 2 and the adjoining metallization 3 in the bond layer 4. After hardening of the bond layer 4 the nanofibers or nanotubes are fixed in this orientation.

The application of the ferromagnetic material or of the nanoparticles made of this material to the nanofiber material or the nanofibers or nanotubes then takes place using a suitable polymer forming a surface adhesive layer, for example using polyaniline.

A further improvement of the thermal properties of the multi-layer material 1 can be achieved by compression of the bond layer 4 after hardening, for example by hipping (HIP process) or by treatment in a vacuum, in order to close any existing bubbles or cavities in the respective bond layer 4.

The invention was described above based on an exemplary embodiment. It goes without saying that numerous modifications and variations are possible without abandoning the underlying inventive idea upon which the invention is based.

In particular, the thermal conductive adhesive or the bond material can be used not only for the manufacture of multi-layer materials or substrates, but also generally for all applications in which an adhesive bond between two components with simultaneous optimum heat transfer is needed.

Due to the nanofiber material with a carbon base the bond material is also electrically conductive, so that it can also be used optimally as an electrically conductive adhesive, i.e. wherever an adhesive electrical connection is desired or required, for example in the mounting of components on printed circuit boards, etc.

Reference List
1 multi-layer material
2 substrate
2.1 base material
2.2 insulating layer
3 metallization
4 adhesive or bond layer
5 heating plate
6,7 measuring plate
8 test piece
9,10 plate
11,12 layer of thermal compound

What is claimed is:

1. A composite material in form of a printed circuit board for electric circuits or modules comprising:

A carrier substrate layer made of an electrically insulating ceramic material having two opposed surface sides, and a metallization consisting essentially of a thin metal plate or foil bonded to each of the two opposed surfaces side of the carrier substrate layer by an adhesive bond layer, wherein the adhesive bond layer comprises a nanofiber material in an adhesive synthetic matrix, and wherein at least a majority of nanofiber material have a length between 1 and 100μ.

2. The composite material according to claim 1, wherein the metal plate or foil is a copper plate or foil.

3. The composite material according to claim 1, wherein the adhesive synthetic matrix layer is made of a matrix with an epoxy base.

4. The composite material according to claim 1, wherein the nanofiber material is oriented at least for the most part in an axis direction perpendicular to mutually adjoining surfaces.

5. The composite material according to claim 1, wherein the adhesive matrix component is polyester.

6. The composite material according to claim 1, wherein the adhesive synthetic matrix contains from 5-30 percent by weight nanofiber material in relation to the total weight.

7. The composite material according to claim 1, wherein carbon nanofibers are used as the nanofiber material.

8. The composite material according to claim 1, wherein the nanofiber material was heated in a pre-treatment at 3000° C. prior to being included in the adhesive synthetic matrix.

9. The composite material according to claim 1, wherein the ceramic substrate is made of an aluminum-oxide ceramic, an aluminum-nitride ceramic or a silicon-nitride ceramic.

10. The composite material according to claim 9, wherein at least one a metallization is structured to form at least one contact surface or at least one strip connector.

11. A composite material in form of a printed circuit board for electric circuits or modules comprising:
A carrier substrate layer consisting of a metallic support layer with insulating layers on each of its surface sides, and a metallization formed from a thin metal plate or foil bonded to each insulating layer of the carrier substrate layer by an adhesive bond layer, wherein the adhesive bond layer comprises a nanofiber material in an adhesive synthetic matrix, and wherein at least a majority of nanofiber material have a length between 1 and 100μ.

12. The composite material according to claim 9, wherein the metal plate or foil is a copper plate or foil.

13. The composite material according to claim 9, wherein the adhesive synthetic matrix layer is made of a matrix with an epoxy base.

14. The composite material according to claim 9, wherein the nanofiber material is oriented at least for the most part in an axis direction perpendicular to mutually adjoining surfaces.

15. The composite material according to claim 9, wherein the adhesive matrix component is polyester.

16. The composite material according to claim 9, wherein the adhesive synthetic matrix contains from 5-30 percent by weight nanofiber material in relation to the total weight.

17. The composite material according to claim 9, wherein carbon nanofibers are used as the nanofiber material.

18. The composite material according to claim 9, wherein the nanofiber material was heated in a pre-treatment at 3000° C. prior to being included in the adhesive synthetic matrix.

19. The composite material according to claim 9, wherein the ceramic substrate is made of an aluminum-oxide ceramic, an aluminum-nitride ceramic or a silicon-nitride ceramic.

20. The composite material according to claim 9, wherein at least one a metallization is structured to form at least one contact surface or at least one strip connector.

* * * * *